United States Patent
Shimizu et al.

(10) Patent No.: US 9,554,069 B2
(45) Date of Patent: Jan. 24, 2017

(54) SOLID-STATE IMAGING APPARATUS CHANGING A GATE VOLTAGE OF A TRANSFER TRANSISTOR, DRIVING METHOD FOR THE SAME, AND IMAGING SYSTEM

(71) Applicant: CANON KABUSHIKI KAISHA, Tokyo (JP)

(72) Inventors: Shinichiro Shimizu, Yokohama (JP); Akira Ohtani, Ebina (JP); Masaru Fujimura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 84 days.

(21) Appl. No.: 14/472,612

(22) Filed: Aug. 29, 2014

(65) Prior Publication Data

US 2015/0070554 A1 Mar. 12, 2015

(30) Foreign Application Priority Data

Sep. 6, 2013 (JP) ................................. 2013-185211

(51) Int. Cl.
*H04N 5/374* (2011.01)
*H04N 5/376* (2011.01)
*H01L 27/146* (2006.01)
*H04N 5/359* (2011.01)

(52) U.S. Cl.
CPC ........ *H04N 5/374* (2013.01); *H01L 27/14612* (2013.01); *H04N 5/3765* (2013.01); *H04N 5/3597* (2013.01)

(58) Field of Classification Search
None
See application file for complete search history.

(56) References Cited

U.S. PATENT DOCUMENTS

| | | |
|---|---|---|
| 6,960,751 B2 | 11/2005 | Hiyama et al. |
| 7,067,792 B2 | 6/2006 | Cazaux et al. |
| 7,393,715 B2 | 7/2008 | Tazoe et al. |
| 7,429,764 B2 | 9/2008 | Koizumi et al. |
| 7,679,658 B2 | 3/2010 | Sakurai et al. |
| 7,808,537 B2 | 10/2010 | Fujimura et al. |
| 7,948,540 B2 | 5/2011 | Ogura et al. |
| 8,106,955 B2 | 1/2012 | Okita et al. |
| 8,212,905 B2 | 7/2012 | Noda et al. |
| 8,305,473 B2 | 11/2012 | Takenaka et al. |
| 8,507,870 B2 | 8/2013 | Arishima et al. |
| 8,530,989 B2 | 9/2013 | Kikuchi et al. |

(Continued)

*Primary Examiner* — Justin P Misleh
(74) *Attorney, Agent, or Firm* — Fitzpatrick, Cella, Harper & Scinto

(57) ABSTRACT

A solid-state imaging apparatus includes: a photoelectric conversion unit configured to convert light into an electric charge; a floating diffusion region configured to convert the electric charge into a voltage; a transfer transistor configured to transfer the electric charge from the photoelectric conversion unit to the floating diffusion region; and a transfer transistor driving circuit configured to control a gate potential of the transfer transistor, wherein the transfer transistor driving circuit controls the gate potential so as to be changed in at least two changing rates during a period of transition from the ON state to the OFF state of the transfer transistor, and the second changing rate out of the two changing rates is higher than the first changing rate.

9 Claims, 11 Drawing Sheets

(56) References Cited

U.S. PATENT DOCUMENTS

| | | |
|---|---|---|
| 8,665,353 B2 | 3/2014 | Fujimura |
| 8,687,246 B2 | 4/2014 | Fujimura et al. |
| 8,710,610 B2 | 4/2014 | Kono et al. |
| 8,836,833 B2 | 9/2014 | Yamashita et al. |
| 2002/0054390 A1* | 5/2002 | Koizumi ............... H04N 1/40 358/513 |
| 2006/0006915 A1* | 1/2006 | Yan ................ H03K 17/164 327/175 |
| 2006/0186504 A1* | 8/2006 | Bae ................. H04N 5/3651 257/462 |
| 2012/0008030 A1 | 1/2012 | Kono et al. |
| 2014/0333817 A1* | 11/2014 | Okita ................ H04N 5/374 348/308 |

* cited by examiner

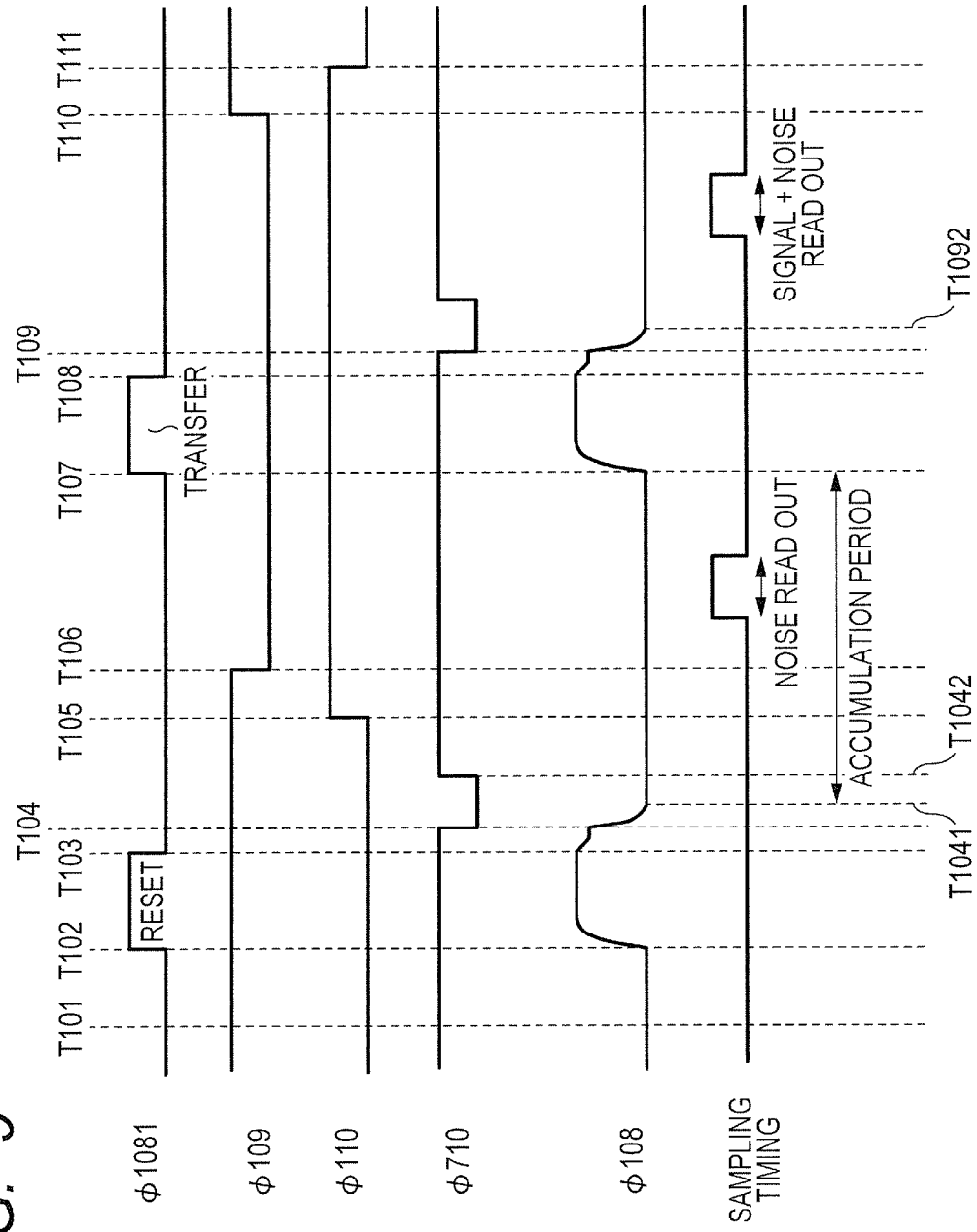

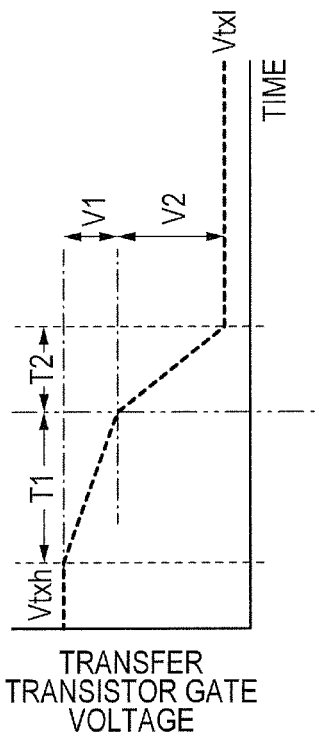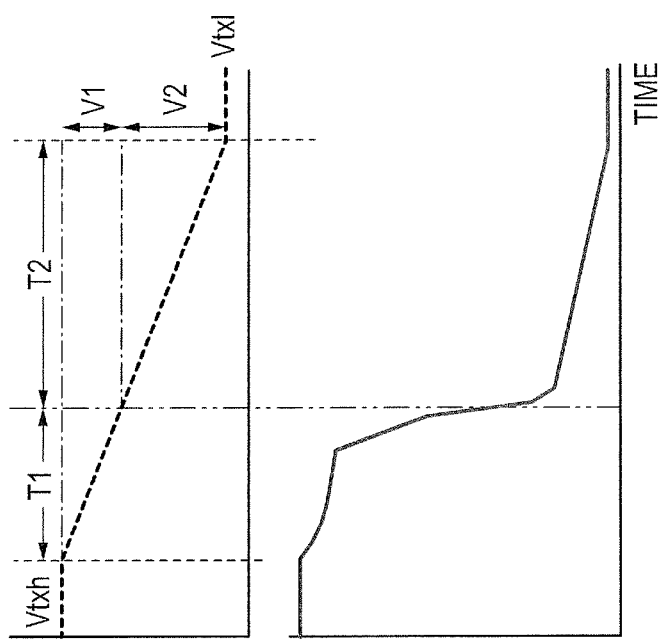

SOLID-STATE IMAGING APPARATUS CHANGING A GATE VOLTAGE OF A TRANSFER TRANSISTOR, DRIVING METHOD FOR THE SAME, AND IMAGING SYSTEM

BACKGROUND OF THE INVENTION

Field of the Invention

The present invention relates to a solid-state imaging apparatus, a driving method for the same, and an imaging system.

Description of the Related Art

The solid-state imaging apparatus transfers an optical signal charge to a floating diffusion (FD) region from a photoelectric conversion unit, by a transfer transistor. In order to suppress an image lag and a random noise occurring at the time, a solid-state imaging apparatus is disclosed (see U.S. Pat. No. 7,067,792, for instance) which keeps a predetermined level of a gate voltage during a period of transition from the ON state to the OFF state of a transfer transistor and controls a transition rate from the ON state to the OFF state.

In the above described solid-state imaging apparatus, it takes time for the transfer transistor to be shifted from the ON state to the OFF state, and as a result, a charge transfer period is increased.

SUMMARY OF THE INVENTION

Means for Solving the Technical Problem

According to an aspect of the present invention, a solid-state imaging apparatus comprises: a photoelectric conversion unit configured to convert light into an electric charge; a floating diffusion region configured to convert the electric charge into a voltage; a transfer transistor configured to transfer the electric charge from the photoelectric conversion unit to the floating diffusion region; and a transfer transistor driving circuit configured to control a gate voltage of the transfer transistor, wherein the transfer transistor driving circuit changes the gate voltage of the transfer transistor in a first changing rate during a first period within a period of transition from an ON state to an OFF state of the transfer transistor, and the transfer transistor driving circuit changes the gate voltage of the transfer transistor in a second changing rate higher than the first changing rate during a second period, following the first period, within the period of transition from the ON state to the OFF state of the transfer transistor.

Further features of the present invention will become apparent from the following description of exemplary embodiments with reference to the attached drawings.

BRIEF DESCRIPTION OF THE DRAWINGS

FIG. 9 is a timing chart in a third embodiment.

FIGS. 10A and 10B are views illustrating transfer transistor gate potentials.

DESCRIPTION OF THE EMBODIMENTS

Preferred embodiments of the present invention will now be described in detail in accordance with the accompanying drawings.

(First Embodiment)

Figure 1:
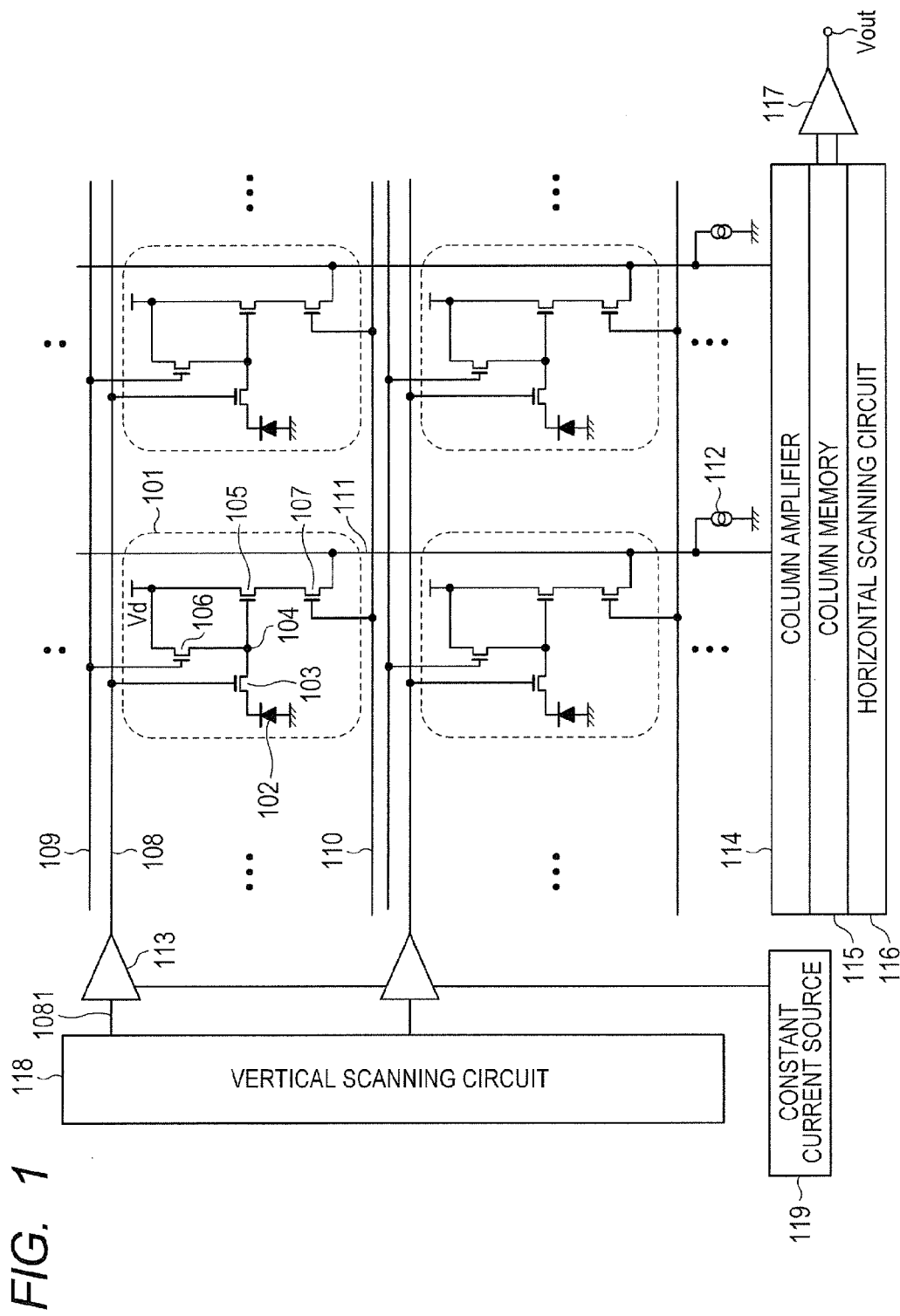
FIG. 1 is a view illustrating a configuration example of a solid-state imaging apparatus according to a first embodiment.

FIG. 1 is a block diagram illustrating a configuration example of a solid-state imaging apparatus according to a first embodiment of the present invention. Pixel units 101 are arranged in a two-dimensional matrix form, and each have a photoelectric conversion unit 102, a transfer transistor 103, a floating diffusion region (hereinafter referred to as FD region) 104, an amplification transistor 105, a reset transistor 106 and a selection transistor 107. Drive wires 108, 109 and 110 are connected to the pixel unit 101. The photoelectric conversion unit 102 is, for instance, a photodiode; and converts incident light into an electric charge and accumulates the electric charge therein. A gate of the transfer transistor 103 is connected to the drive wire 108. A vertical scanning circuit 118 outputs a drive signal to the drive wire 108 through a transfer transistor driving circuit 113. A drive wire 1081 is connected between the vertical scanning circuit 118 and the transfer transistor driving circuit 113. The transfer transistor driving circuit 113 controls a gate potential of the transfer transistor 103. The drive wire 109 is connected to a gate of the reset transistor 106. The drive wire 110 is connected to a gate of the selection transistor 107. A constant current source 119 is a common constant current source which drives each of the transfer transistor driving circuits 113. The transfer transistor 103 transfers the electric charge accumulated in the photoelectric conversion unit 102 to the FD region 104, when the drive wire 108 becomes a high level. The FD region 104 converts the electric charge into voltage. The amplification transistor 105 amplifies the voltage of the FD region 104. The selection transistor 107 outputs the voltage amplified by the amplification transistor 105 to a vertical output line 111, when the drive wire 110 becomes a high level. The vertical output line 111 in each of the columns is connected in common to the pixel units 101 in each of the columns. A constant current circuit 112 is connected to each of the vertical output lines 111. The reset transistor 106 resets the voltages of the FD region 104 and/or the photoelectric conversion unit 102 to a power source voltage Vd, when the drive wire 109 becomes a high level. A column amplifier circuit 114 amplifies the voltage of the vertical output line 111, and writes the amplified voltage in a column memory 115. A horizontal scanning circuit 116 sequentially outputs the voltages of each column, which have been written in the column memory 115, to an output amplifier 117. The output amplifier 117 amplifies an input voltage and outputs an output voltage Vout. In addition to the above, in order to reduce the noise, a noise reduction circuit such as a CDS (Correlated Double Sampling) circuit may further be provided. The noise reduction circuit may be provided as an independent circuit, or may be configured so as to share a part of the circuit with the column amplifier circuit 114, for instance.

Figure 2:
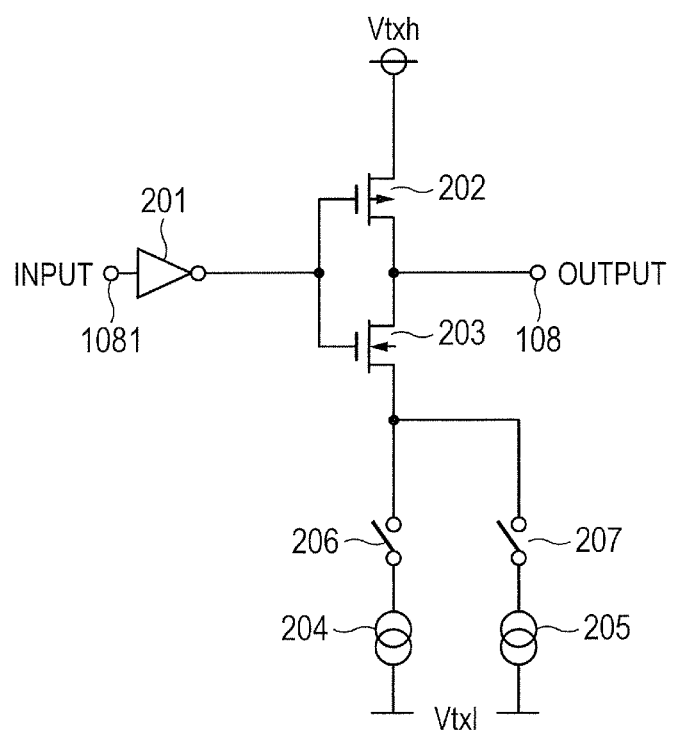
FIG. 2 is a view illustrating a transfer transistor driving circuit in the first embodiment.

FIG. 2 is a circuit diagram illustrating a configuration example of the transfer transistor driving circuit 113 in FIG. 1. An inverter circuit 201, a PMOS transistor 202, an NMOS transistor 203, constant current circuits 204 and 205, and switches 206 and 207 are shown. An input terminal of the inverter circuit 201 is connected to the drive wire 1081. The constant current circuits 204 and 205 are connected to a potential Vtxl which determines an OFF state of the transfer transistor 103. This potential Vtxl may be a ground potential, or may be a negative potential. In FIG. 2, the potential Vtxl is the ground potential.

When the input potential of the inverter 201 is a high level, the PMOS transistor 202 is turned ON, and a power source potential Vtxh which determines an ON state of the transfer transistor 103 is applied to the transfer transistor drive wire 108. When the input potential of the inverter 201 is a low level, the NMOS transistor 203 is turned ON, and the ground potential is applied to the transfer transistor drive wire 108. At this time, the gate potential of the transfer transistor 103 decays from the potential Vtxh to the potential Vtxl, due to an electric current of any of the constant current circuits 204 and 205 connected to the NMOS transistor 203 through the switches 206 and 207, and the decaying time is determined by a value of the current.

Figure 3:
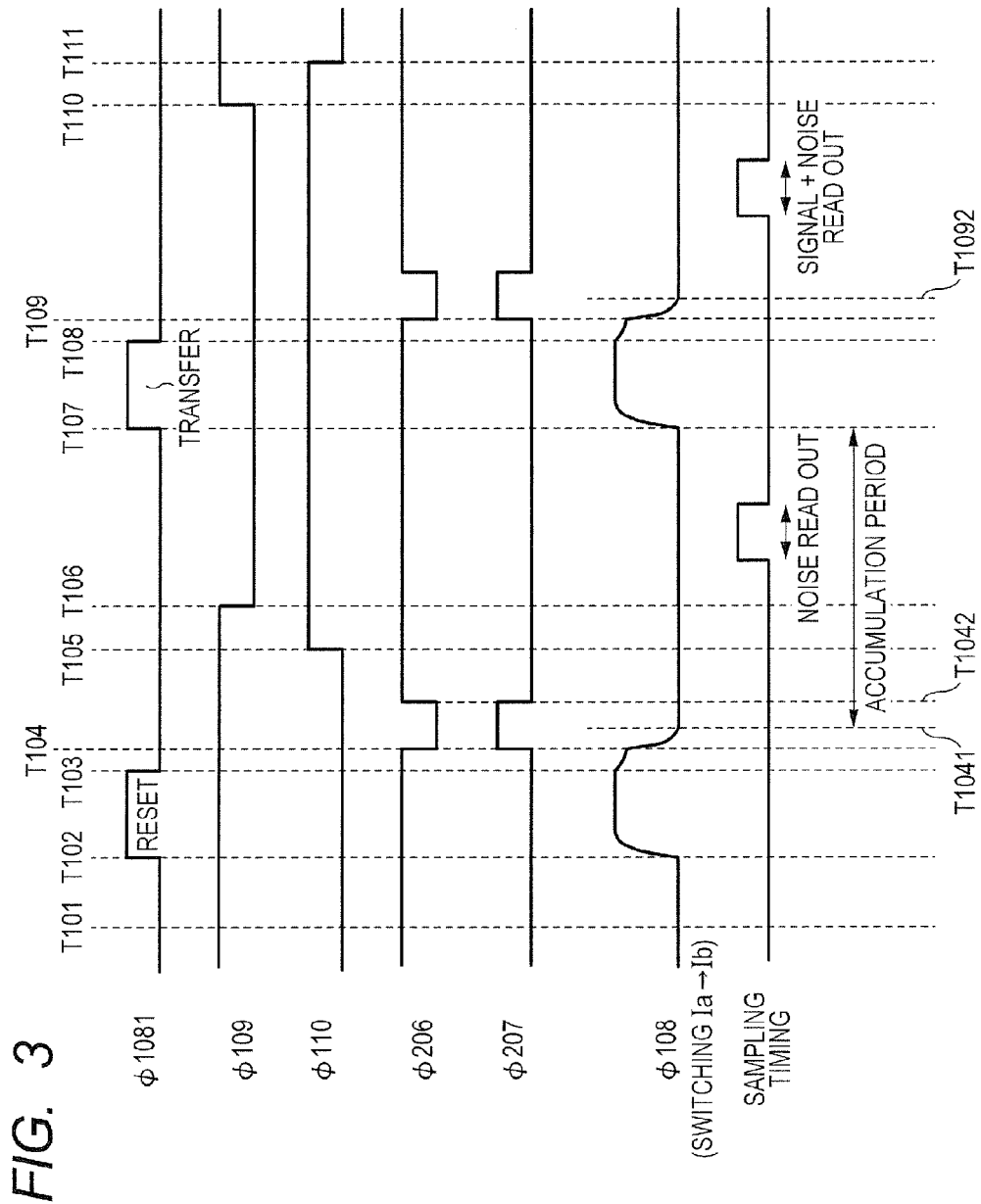
FIG. 3 is a timing chart in the first embodiment.

FIG. 3 is a timing chart illustrating a driving method for the solid-state imaging apparatus in FIG. 1. The solid-state imaging apparatus operates in order of reset for the FD region 104, the read out of a reset noise, optical signal charge transfer, and the read out of an optical signal and a reset noise. In FIG. 3, a period between the times T102 and T1041 is substantially a residual-charge reset period for the pixel unit 101. In a first operation mode, all the pixel units 101 are collectively reset during this period between the times T102 and T1041, and the operation proceeds to an accumulation period. The first operation mode is, for instance, an operation mode for taking a still image. In addition, in a second operation mode, the collective reset period between the times T102 and T1041 may be omitted. The second operation mode is, for instance, an operation mode for taking a moving image, and a driving operation after the time T1042 is repeated. In this case, a transfer of an accumulated electric charge, specifically, a period between the times T107 and T1092, means reset for the pixel unit 101 (photoelectric conversion unit 102). The driving method will be described below in detail. A voltage φ1081 shows a voltage of the drive wire 1081, a voltage φ109 shows a voltage of the drive wire 109, a voltage φ110 shows a voltage of the drive wire 110, a voltage φ206 shows a control voltage for the switch 206, a voltage φ207 shows a control voltage for the switch 207, and a voltage φ108 shows a voltage of the drive wire 108. In the following timing chart, each switch shall be turned ON when a control signal is a high level.

At the time T101, the voltage φ109 is a high level, the reset transistor 106 is turned ON, and the FD region 104 is reset to a power source potential Vd. At the time T102, the input voltage φ1081 of the transfer transistor driving circuit 113 changes to a high level from a low level, thereby the output voltage φ108 becomes a high level, and the transfer transistor 103 is turned ON. As a result, the photoelectric conversion unit 102 is reset to the power source potential Vd, and a residual charge is removed.

At the time T103, the input voltage φ1081 changes from the high level to the low level, the NMOS transistor 203 is turned ON, and the constant current circuit 204 operates which is connected to the NMOS transistor 203 through the switch 206. The gate voltage φ108 of the transfer transistor 103 starts changing from the potential Vtxh to the ground potential, at a speed corresponding to a constant current Ia which is supplied by the constant current circuit 204. At the time T104, the control voltage φ206 changes from a high level to a low level, the switch 206 is turned OFF, and the constant current circuit 204 is separated from the NMOS transistor 203. At the same time, the control voltage φ207 changes from a low level to a high level, the switch 207 is turned ON, and the constant current circuit 205 operates. The gate voltage φ108 of the transfer transistor 103 decays to the potential Vtxl (here, ground potential), at a speed corresponding to a constant current Ib which is supplied by the constant current circuit 205, and completes the reset of the electric charge in the photoelectric conversion unit 102. The constant currents Ia and Ib at this time satisfy a relationship of Ia<Ib, and for instance, when Ib is three times larger than Ia, a decaying slope from the time T104 becomes three times steeper than, in other words, the decaying speed becomes three times faster than the decaying slope from the time T103. At the time T104, the control voltage φ206 may be kept at the high level. In this case, the decaying slope from the time T104 becomes four times steeper than, in other words, the decaying speed becomes four times faster than the decaying slope from the time T103. The time T1041 at which the reset of the pixel unit 101 has been completed becomes a starting time of electric charge accumulation in the pixel unit 101. In the operation from the time T103 to the time T1041, the potential Vtxh which is given to the gate of the transfer transistor 103 is a first potential, and the potential Vthl is a second potential. The transfer transistor 103 becomes ON state when the potential of the gate is the first potential, and becomes OFF state when the potential of the gate is the second potential. The gate potential of the transfer transistor 103 at the time T104 is a third potential in between the first and the second potentials. Accordingly, the above described operation can be said, in other words, as an operation of changing the potential of the gate of the transfer transistor 103 from the first potential to the third potential at a first changing rate, and subsequently changing the third potential to the second potential at a second changing rate which is higher than the first changing rate.

At the time T105, the selection control voltage φ110 changes from a low level to a high level, the selection transistor 107 is turned ON, and the amplification transistor 105 is connected to the vertical output line 111. At the time T106, the reset control voltage φ109 changes from the high level to the low level, the reset transistor 106 is turned OFF, a reset operation of the FD region 104 is completed, and the FD region 104 becomes a floating state. The voltage of the FD region 104 is sampled as a noise level by the column amplifier 114, within a period between the time T106 and the time T107, and is written in the column memory 115.

At the time T107, the input voltage φ1081 changes from the low level to the high level, the transfer transistor 103 is turned ON, and the optical signal charge which has been accumulated in the photoelectric conversion unit 102 is transferred to the FD region 104. The ON/OFF operation of the transfer transistor 103 is performed in a similar way to the reset operation described previously. At the time T108, the input voltage φ1081 changes from the high level to the low level, the NMOS transistor 203 is turned ON, and the constant current circuit 204 operates which is connected to the NMOS transistor 203 through the switch 206. The gate voltage φ108 of the transfer transistor 103 starts changing from the potential Vtxh to the ground potential, at a speed corresponding to the constant current Ia which is supplied by the constant current circuit 204. At the time T109, the control voltage φ206 changes from the high level to the low level, the switch 206 is turned OFF, and the constant current circuit 204 is separated from the NMOS transistor 203. At the same time, the control voltage φ207 changes from the low level to the high level, the switch 207 is turned ON, and the constant current circuit 205 operates. The gate voltage φ108 of the transfer transistor 103 decays to the ground potential, at a speed corresponding to the constant current Ib which is supplied by the constant current circuit 205, and completes the reset of the electric charge in the photoelectric conversion unit 102. After the gate voltage φ108 of the transfer transistor 103 has decayed to the ground potential, the voltage of the FD region 104 is sampled as the optical signal (including noise level) by the column amplifier 114, and is written in the column memory 115. The horizontal scanning circuit 116 reads out the noise level and the optical signal (including noise level) which are stored in the column memory 115, and outputs the noise level and the optical signal to the output amplifier 117. The output amplifier 117 outputs the difference between the noise level and the optical signal (including noise level), as a pixel signal. As a result, the noise level is reduced in the pixel signal.

At the time T110, the reset control voltage φ109 changes from the low level to the high level, and the reset transistor 106 is turned ON. At the time T111, the selection control voltage φ110 changes from the high level to the low level, and the selection transistor 107 is turned OFF.

FIG. 10A is a simulation result illustrating a relationship between the gate potential φ108 of the transfer transistor 103 and the concentration of electrons which exist in a potential pocket under the gate of the transfer transistor 103. According to FIG. 10A, it is understood that the concentration of the electrons which exist in the potential pocket greatly decreases during a period T1 in which the gate potential φ108 of the transfer transistor 103 falls from the potential Vtxh by a voltage V1. Specifically, a period T2 in which the gate potential φ108 falls to the potential Vtxl by a voltage V2 after the period T1 much less contributes to the return of electrons.

In the present embodiment, as illustrated in FIG. 10B, the return of the electrons is suppressed by controlling a decaying rate so as to be moderate in the vicinity of the potential at which the contribution to the return of the electrons is large, and a transfer period is shortened by controlling the decaying rate so as to be steep in the vicinity of the potential at which the contribution to the return of the electrons is little. Specifically, the relationship of |V1/T1|≤|V2/T2| holds. In the present embodiment, the gate potential φ108 of the transfer transistor 103 in a period around the time at which the potential pocket under the gate of the transfer transistor 103 is separated from the FD region 104 is changed in the following way, with respect to the high level (5 [V]) of the gate potential φ108. The gate potential φ108 is changed, for instance, from 5 [V] to 3.5 [V] in about 0.3 μsec at a moderate slope, and subsequently, is changed from 3.5 [V] to −1.4 [V] in about 0.3 μsec along a steep slope.

In U.S. Pat. No. 7,067,792, such a phenomenon occurs that electrons existing in the potential pocket under the gate of the transfer transistor 103 return to the photoelectric conversion unit 102 side, (which is referred to as return of electron), when the transfer transistor 103 is turned OFF, at the time of reset and at the time of optical signal charge transfer. At the time of the reset, an image lag noise occurs due to a phenomenon that the returned electrons are superimposed on an optical signal. In addition, at the time of the read out of the optical signal charge, a black noise occurs due to the returned electrons.

Figure 4:
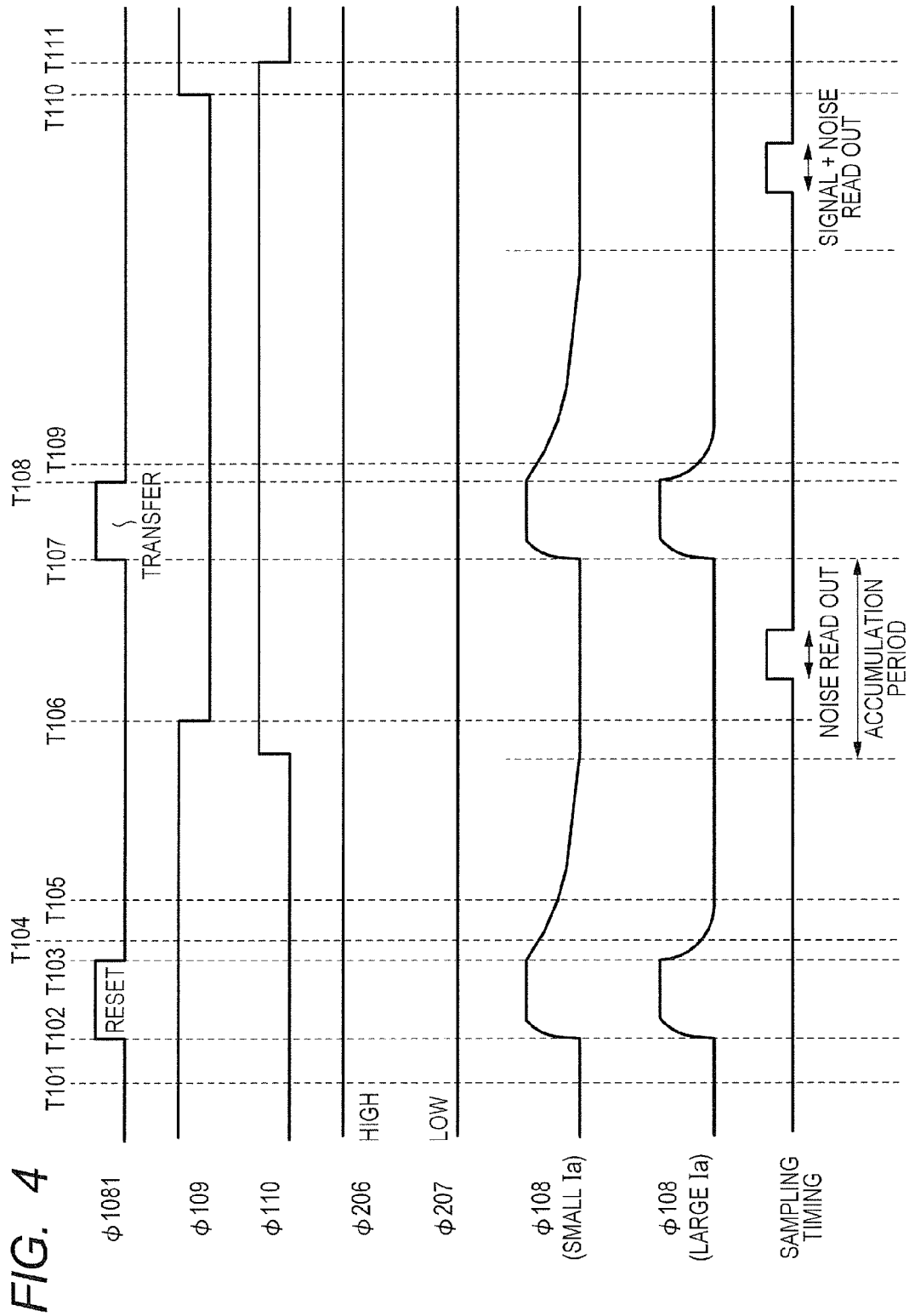
FIG. 4 is a timing chart in the case where current sources are not switched.

FIG. 4 corresponds to FIG. 3, and illustrates the operation timing and the waveform of the gate potentials φ108 of the transfer transistor, in the case where the constant current circuits 204 and 205 are not switched. The control voltage φ206 is fixed at the high level, the control voltage φ207 is fixed at the low level, and an operation of turning the transfer transistor 103 OFF is performed only by the constant current Ia which is supplied from the constant current circuit 204. At this time, the time period Toff necessary for the OFF operation is determined by the following relation concerning the potential difference ΔV between the high level and the low level, the capacitance C in total of a gate capacitance of the transfer transistor 103 and a parasitic capacitance, and the constant current Ia.

$$Toff = \Delta V \times C / Ia$$

If the constant current Ia is decreased so as to obtain an effective decaying rate in order to suppress the return of electrons, the time period increases which is necessary for the gate potential φ108 of the transfer transistor 103 to reach the potential Vtxl. As a result, it becomes necessary to lengthen the period, in particular, between optical signal charge transfer and the read out of an optical signal (including noise). If the constant current Ia is increased in order to shorten this period, such trade-off occurs that an effect of suppressing the return of the electrons decreases. The present inventors have found that the effect of suppressing the return of the electrons is large in the first half of the period in which the transfer transistor shifts to the OFF state from the ON state. For this reason, the driving method in the present embodiment can achieve both of the suppression of the image lag occurring due to the return of the electrons and the shortening of the charge transfer period, by changing the gate potential of the transfer transistor in at least two changing rates and setting a temporally later changing rate so as to be higher than a temporally earlier changing rate. In other words, the driving method in the present embodiment changes the gate potential of the transfer transistor at the first changing rate, during the first period within a period in which the transfer transistor changes from the ON state to the OFF state; and subsequently changes the gate potential of the transfer transistor at the second changing rate which is higher than the first changing rate, during the second period following the first period, within the period in which the transfer transistor changes from the ON state to the OFF state.

As has been described above, the transfer transistor driving circuit 113 controls such that the gate potential φ108 changes in least at two changing rates during the period of transition from the ON state to the OFF state of the transfer transistor 103. The temporally later changing rate out of two changing rates is higher than the temporally earlier changing rate. Specifically, the transfer transistor driving circuit 113 changes the gate potential in at least two changing rates, by changing the value of the current which flows into the gate of the transfer transistor 103. The transfer transistor driving circuit 113 controls the value of the current so that the value of the current which flows into the gate of the transfer transistor 103 at the temporally later changing rate becomes larger than the value of the current which flows into the gate of the transfer transistor 103 at the temporally earlier changing rate. In the case of FIG. 2, the transfer transistor driving circuit 113 connects the first constant current circuit 204 to the gate of the transfer transistor 103 in order to set the changing rate at the temporally earlier changing rate, and connects the second constant current circuit 205 to the gate of the transfer transistor 103 in order to set the changing rate at the temporally later changing rate. According to the present embodiment, the image lag can be suppressed and the charge transfer period can be shortened.

(Second Embodiment)

Figure 5:
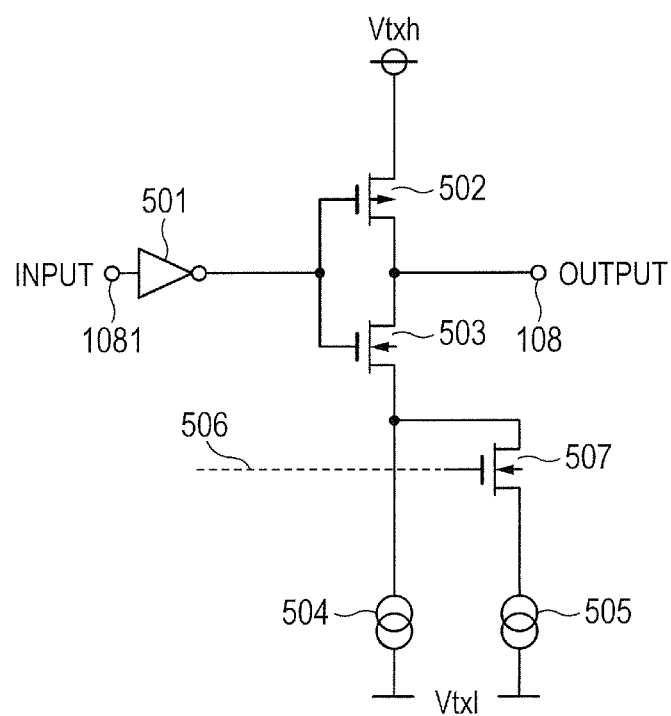
FIG. 5 is a view illustrating a transfer transistor driving circuit in a second embodiment.

FIG. 5 is a circuit diagram illustrating a configuration example of a transfer transistor driving circuit 113 according to a second embodiment of the present invention. The present embodiment (FIG. 5) has such a configuration that the switch 206 is removed from the configuration of the first embodiment (FIG. 3). An inverter circuit 501, a PMOS transistor 502, NMOS transistors 503 and 507, constant current circuits 504 and 505, and a control line 506 which controls NMOS transistor 507 are shown. The constant current circuits 504 and 505 are connected to the potential Vtxl.

When the input line 1081 of the inverter 501 is the high level, the PMOS transistor 502 is turned ON and the potential Vtxh is supplied to the transfer transistor drive wire 108. When the input line 1081 of the inverter 501 is the low level, the NMOS transistor 503 is turned ON and the potential Vtxl is supplied to the transfer transistor drive wire 108. A rate at which the potential of the gate line 108 of the transfer transistor 103 decays from the potential Vtxh to the potential Vtxl is determined by the value of the current of the constant current circuit 504 which is connected to the NMOS transistor 503 and the constant current circuit 505 which is connected to the NMOS transistor 503 through the NMOS transistor 507.

Figure 6:
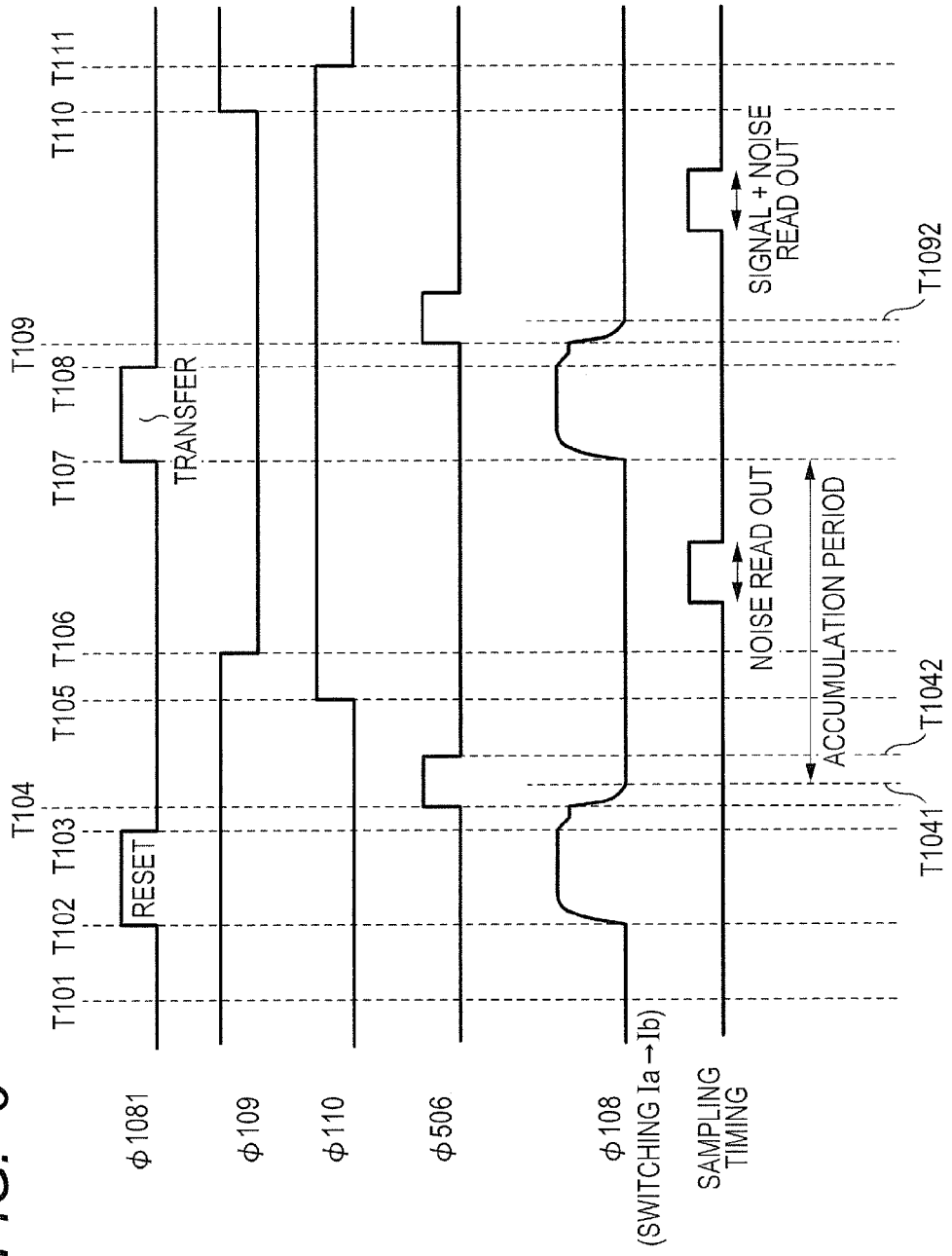
FIG. 6 is a timing chart in the second embodiment.

FIG. 6 is a timing chart corresponding to FIG. 3 and illustrating a driving method for a solid-state imaging apparatus according to the second embodiment. Here, only an OFF operation of the transfer transistor 103 will be described, in which the present embodiment is different from the first embodiment. As for other points in the driving method, the present embodiment is the same as the first embodiment. A control voltage φ506 is a voltage of the control line 506.

At the times T103 and T108, the input voltage φ1081 becomes the low level, the NMOS transistor 503 is turned ON, and the constant current circuit 504 operates. At this time, the control voltage φ506 is the low level, the NMOS transistor 507 is turned OFF, and the constant current circuit 505 does not operate. The gate potential φ108 of the transfer transistor 103 starts changing from the potential Vtxh to the potential Vtxl, at a speed corresponding to the constant current Ia which is supplied by the constant current circuit 504. At the times T104 and T109, the control voltage φ506 changes from the low level to the high level, the NMOS transistor 507 is turned ON, and the constant current circuit 505 operates. The gate potential φ108 of the transfer transistor 103 decays to the potential Vtxl at a speed corresponding to the sum (Ia+Ib) of the constant current Ia which is supplied by the constant current circuit 504 and the constant current Ib which is supplied by the constant current circuit 505. The decaying rate of the gate potential φ108 from the times T104 and T109 is higher than the decaying rate of the gate potential φ108 from the times T103 and T108. The present embodiment can provide the same effect as that of the first embodiment.

As has been described above, the transfer transistor driving circuit 113 controls such that the gate potential φ108 changes in at least two changing rates during the period of transition from the ON state to the OFF state of the transfer transistor 103. The temporally later changing rate out of two changing rates is higher than the temporally earlier changing rate. The transfer transistor driving circuit 113 connects the first constant current circuit 504 to the gate of the transfer transistor 103, in order to set the changing rate at the temporally earlier changing rate. In addition, the transfer transistor driving circuit 113 connects the first constant current circuit 504 and the second constant current circuit 505 to the gate of the transfer transistor 103, in order to set the changing rate at the temporally later charging rate.

(Third Embodiment)

Figure 7:
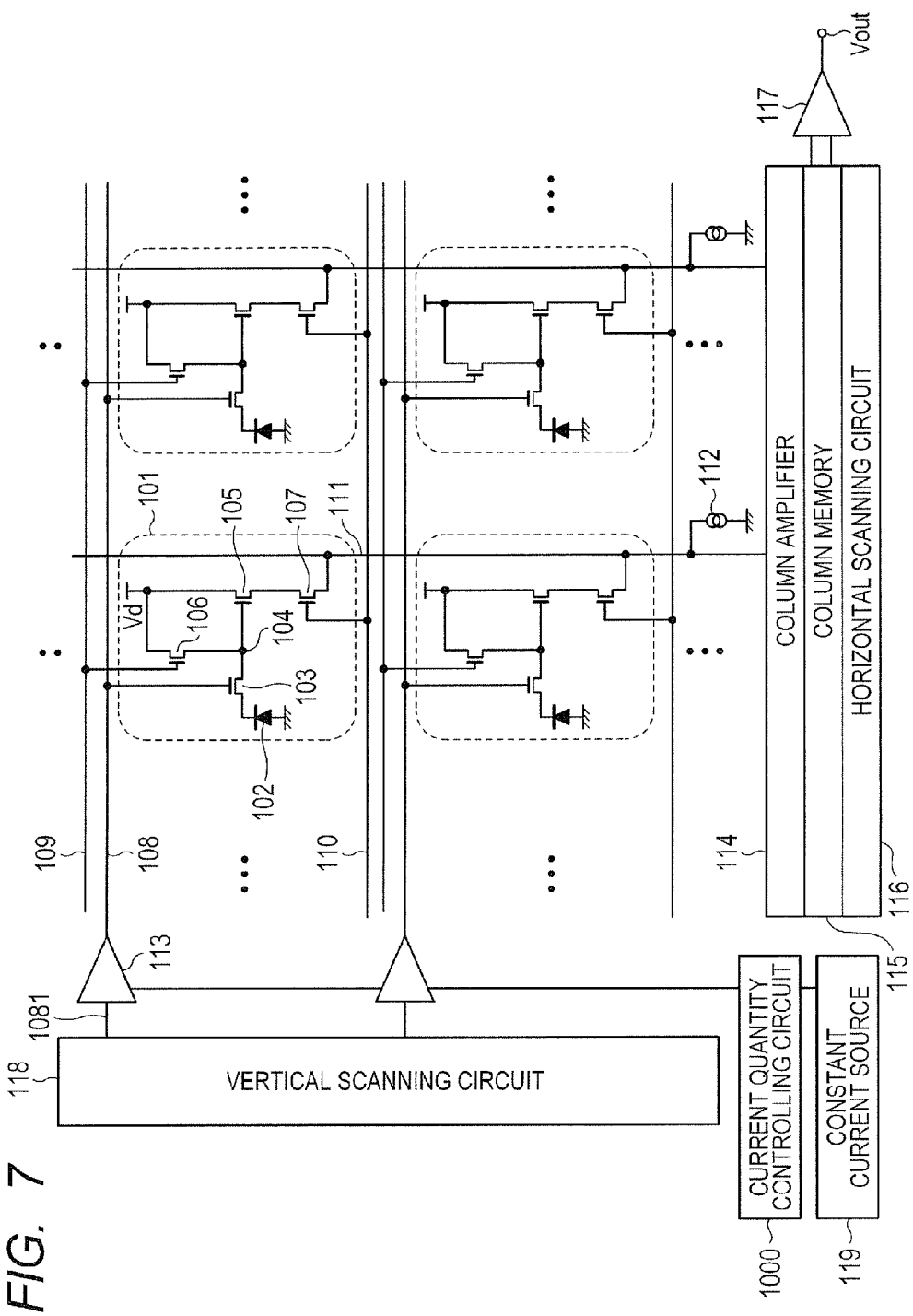
FIG. 7 is a view illustrating a solid-state imaging apparatus according to the second embodiment.

FIG. 7 is a view illustrating a configuration example of a solid-state imaging apparatus according to a third embodiment of the present invention. The present embodiment (FIG. 7) has such a configuration that a current quantity controlling circuit 1000 is added to the configuration of the first embodiment (FIG. 1). The current quantity controlling circuit 1000 is provided in between the constant current source 119 and the transfer transistor driving circuit 113. Hereafter, a point will be described in which the present embodiment is different from the first embodiment.

Figure 8A:
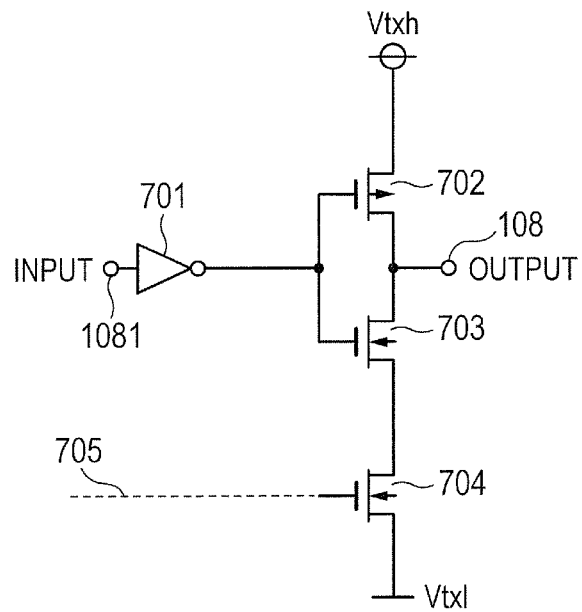
FIGS. 8A and 8B are views illustrating a transfer transistor driving circuit and a current quantity controlling circuit.

FIG. 8A is a circuit diagram corresponding to FIG. 2 and illustrating a configuration example of the transfer transistor driving circuit 113 in FIG. 7. An inverter circuit 701, a PMOS transistor 702, NMOS transistors 703 and 704, and a drive wire 705 which supplies the gate potential of the NMOS transistor 704 and is connected to the current quantity controlling circuit 1000 in FIG. 7 are shown.

Figure 8B:
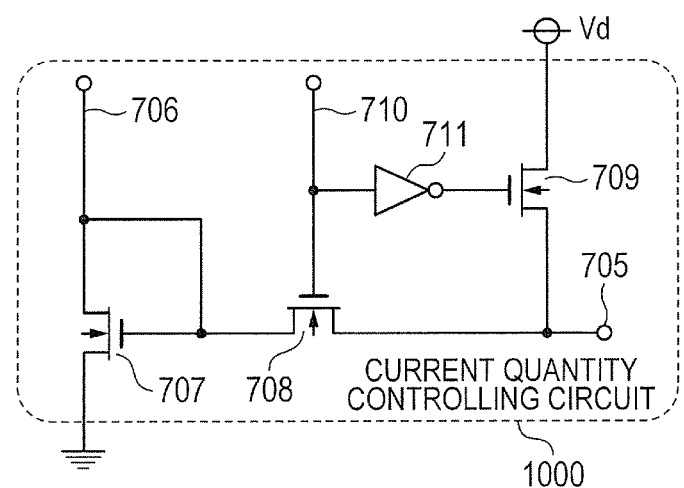

FIG. 8B is a circuit diagram illustrating a configuration example of the current quantity controlling circuit 1000 in FIG. 7. A wire 706 is shown which is connected to the constant current source 119 in FIG. 7. The NMOS transistors 707, 708 and 709 are shown. A wire 710 is shown which supplies a pulse for changing a driving mode. An inverter 711 is shown. The NMOS transistors 707 and 704 form a current mirror; and the current quantity controlling circuit supplies, out of a constant current supplied from the wire 706, the electric current which is determined by a mirror ratio K704/K707 that is given by K=W/L which is a ratio of a gate width W to a gate length L, to the NMOS transistor 704. K704 is a ratio K of the NMOS transistor 704, and K707 is a ratio K of the NMOS transistor 707.

FIG. 9 is a timing chart corresponding to FIG. 3 and illustrating a driving method for the solid-state imaging apparatus according to the third embodiment. A control voltage φ710 is a voltage of the wire 710. According to the present embodiment, the operation state of the NMOS transistor 704 is switched by the current quantity controlling circuit 1000 illustrated in FIG. 8B. Hereafter, a point will be described in which the present embodiment (FIG. 9) is different from the first embodiment (FIG. 3). When the control voltage φ710 is a high level, the NMOS transistor 708 is turned ON and an electric current Id flows into the NMOS transistor 704, which is determined by the mirror ratio of the NMOS transistors 707 and 704 out of an electric current Ic that is supplied to the wire 706. On the other hand, when the control voltage φ710 is a low level, the NMOS transistor 709 is turned ON, the potential of the wire 705 becomes a potential of the power source potential Vd, and thereby the NMOS transistor 704 is turned ON.

At the times T103 and T108, the input voltage φ1081 becomes the low level, and the NMOS transistor 703 is turned ON. At this time, the control voltage φ710 is the high level, and the gate potential φ108 of the transfer transistor 103 starts changing from the potential Vtxh to the potential Vtxl at a rate corresponding to the constant current Id. At the times T104 and T109, the control voltage φ710 is the low level, the NMOS transistor 709 is turned ON, and the NMOS transistor 704 is turned ON. Thereby, the gate potential φ108 of the transfer transistor 103 decays to the potential Vtxl at a decaying rate higher than the decaying rate due to the constant current Id. The decaying rate of the gate potential ϕ108 from the times T104 and T109 is higher than the decaying rate of the gate potential ϕ108 from the times T103 and T108. The present embodiment can provide the same effect as that of the first embodiment.

As has been described above, the transfer transistor driving circuit 113 controls such that the gate potential ϕ108 changes in at least two changing rates during the period of transition from the ON state to the OFF state of the transfer transistor 103. The temporally later changing rate out of two changing rates is higher than the temporally earlier changing rate. The transfer transistor driving circuit 113 has a constant current transistor 704 which is connected (turned ON) to the potential Vtxl during the period of transition from the ON state to the OFF state of the transfer transistor 103. The gate potential of the constant current transistor 704 during the change in the temporally later changing rate is different from the gate potential of the constant current transistor 704 during the change in the temporally earlier changing rate.

(Fourth Embodiment)

Figure 11:
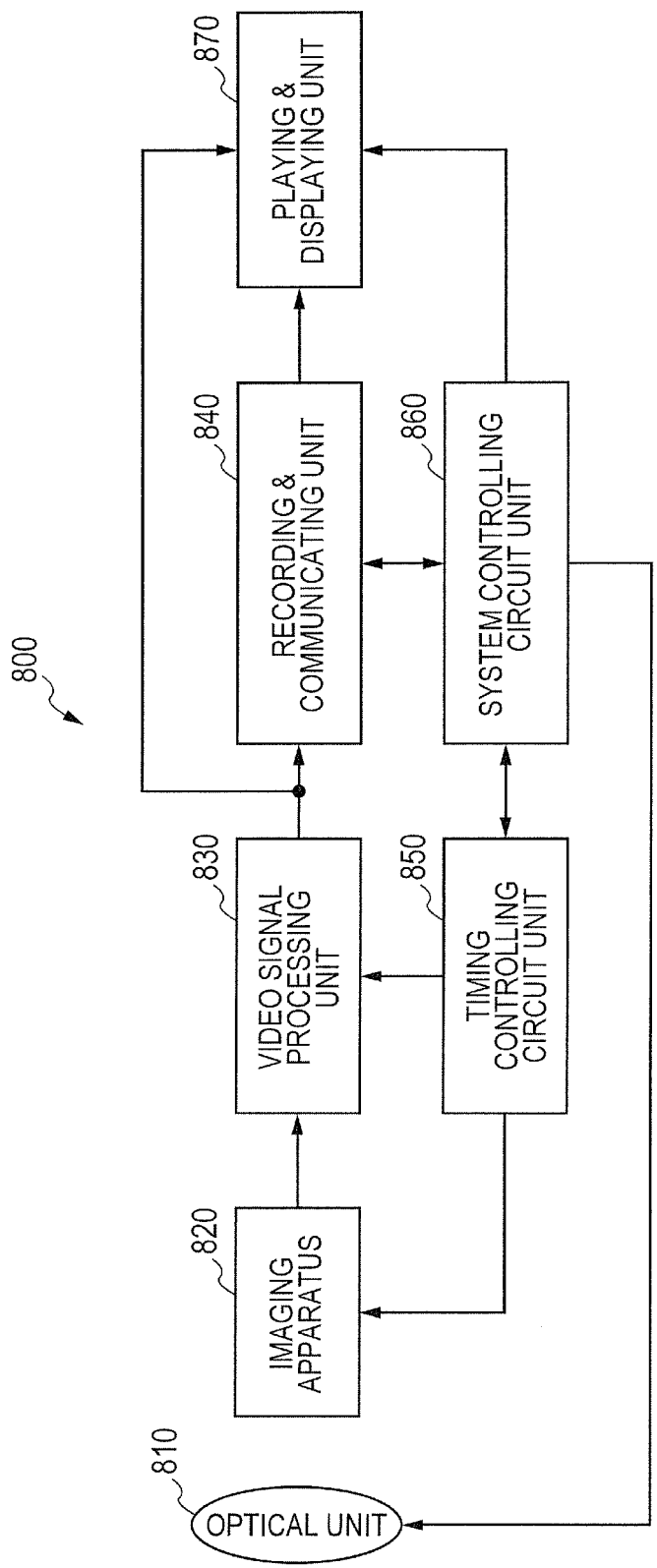
FIG. 11 is a view illustrating a configuration example of an imaging system.

FIG. 11 is a view illustrating a configuration example of an imaging system according to a fourth embodiment of the present invention. An imaging system 800 includes, for instance, an optical unit 810, an imaging apparatus 820, a video signal processing circuit unit 830, a recording & communicating unit 840, a timing controlling circuit unit 850, a system controlling circuit unit 860, and a playing & displaying unit 870. The imaging apparatus 820 is a solid-state imaging apparatus of the first to third embodiments.

The optical unit 810, which is an optical system such as a lens, focuses an image of light emitted from an object onto a pixel unit 101 of the imaging apparatus 820, in which a plurality of pixels are two-dimensionally arrayed, and forms an image of the object on the pixel unit 101. The imaging apparatus 820 outputs signals depending on the light of image focused on the pixel unit 101, on the timing based on the signal output from the timing controlling circuit unit 850. The signals output from the imaging apparatus 820 are input into the video signal processing circuit unit 830 that is a video signal processing unit, and the video signal processing circuit unit 830 performs signal processing with a specified method by a program or the like. The signals obtained by the processing in the video signal processing circuit unit 830 are sent to the recording & communicating unit 840 as image data. The recording & communicating unit 840 sends signals for forming an image to the playing & displaying unit 870, and makes the playing & displaying unit 870 play & display a moving image or a still image. The recording & communicating unit 840 also communicates with the system controlling circuit unit 860 by receiving the signals sent from the video signal processing circuit unit 830, and also performs an operation of recording the signals for forming an image on an unillustrated recording medium.

The system controlling circuit unit 860 is a unit for collectively controlling an operation of the imaging system, and controls a drive of each of the optical unit 810, the timing controlling circuit unit 850, the recording & communicating unit 840, and the playing & displaying unit 870. In addition, the system controlling circuit unit 860 is provided, for instance, with an unillustrated storage unit that is a recording medium, and records a program and the like which are necessary for controlling the operation of the imaging system, in the storage unit. The system controlling circuit unit 860 also supplies, for instance, a signal which switches driving modes in response to an operation of a user, into the imaging system. Specific examples include: a signal for a change of a line to be read or a line to be reset; a signal for a change of an angle of view, which accompanies an operation of an electronic zoom; and a signal for a shift of an angle of view, which accompanies electronic vibration control. The timing controlling circuit unit 850 controls the driving timings for the imaging apparatus 820 and the video signal processing circuit unit 830 based on the control by the system controlling circuit unit 860.

Note that the above embodiments are merely examples how the present invention can be practiced, and the technical scope of the present invention should not be restrictedly interpreted by the embodiments. In other words, the present invention can be practiced in various ways without departing from the technical concept or main features of the invention.

For instance, in the above described embodiments, an example has been described in which the gate potential of the transfer transistor is changed in a slope-like form with respect to a time period by using a constant current source, but the gate potential may be changed in a step-like form. According to each of the above described embodiments, the charge transfer period can be shortened while an image lag is suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-185211, filed Sep. 6, 2013, which is hereby incorporated by reference herein in its entirety.

What is claimed is:

1. A solid-state imaging apparatus comprising:
   a photoelectric conversion unit configured to convert light into an electric charge;
   a floating diffusion region;
   a transfer transistor configured to transfer the electric charge from the photoelectric conversion unit to the floating diffusion region; and
   a transfer transistor driving circuit configured to control a gate voltage of the transfer transistor,
   wherein the transfer transistor driving circuit changes the gate voltage of the transfer transistor in a first changing rate during a first period within a period of transition from an ON state to an OFF state of the transfer transistor, and
   the transfer transistor driving circuit changes the gate voltage of the transfer transistor in a second changing rate higher than the first changing rate during a second period, continuously following the first period, within the period of transition from the ON state to the OFF state of the transfer transistor.

2. The solid-state imaging apparatus according to claim 1, wherein the transfer transistor driving circuit switches between the first changing rate and the second changing rate, by changing a value of a current flowing through a gate of the transfer transistor.

3. The solid-state imaging apparatus according to claim 1, wherein the transfer transistor driving circuit controls such that a value of a current flowing through a gate of the transfer transistor during the changing the gate voltage of the transfer transistor in the second changing rate is larger than a value of the current flowing through the gate of the transfer transistor during the changing the gate voltage of the transfer transistor in the first changing rate.

4. The solid-state imaging apparatus according to claim 1, wherein the transfer transistor driving circuit connects the gate voltage of the transfer transistor to a first constant current circuit to set the gate voltage of the transfer transistor to be changed in the first changing rate, while the transfer transistor driving circuit connects the gate voltage of the transfer transistor to a second constant current circuit to set the gate voltage of the transfer transistor to be changed in the second changing rate.

5. The solid-state imaging apparatus according to claim 1, wherein the transfer transistor driving circuit connects the gate voltage of the transfer transistor to a first constant current circuit to set the gate voltage of the transfer transistor to be changed in the first changing rate, while the transfer transistor driving circuit connects the gate voltage of the transfer transistor to a first constant current circuit and a second constant current circuit to set the gate voltage of the transfer transistor to be changed in the second changing rate.

6. The solid-state imaging apparatus according to claim 1, wherein the transfer transistor driving circuit has a constant current transistor to be turned on during the period of transition from the ON state to the OFF state of the transfer transistor, and
  a gate voltage of the constant current transistor during the changing the gate voltage of the transfer transistor in the second changing rate is different from a gate voltage of the constant current transistor during the changing the gate voltage of the transfer transistor in the first changing rate.

7. The solid-state imaging apparatus according to claim 1, wherein the first changing rate is a rate of changing in a direction from the ON state closer to the OFF state, and the second changing rate is a rate of changing in a direction from the ON state closer to the OFF state.

8. A solid-state imaging system comprising:
  the solid-state imaging apparatus according to claim 1; and
  an optical unit configured to focus light to form an image on the solid-state imaging apparatus.

9. A driving method of a solid-state imaging apparatus, wherein the solid-state imaging apparatus comprises:
  a photoelectric conversion unit configured to convert light into an electric charge;
  a floating diffusion region configured to convert the electric charge into a voltage; and
  a transfer transistor configured to transfer the electric charge from the photoelectric conversion unit to the floating diffusion region,
  wherein the method comprises:
  changing a gate voltage of the transfer transistor in a first changing rate during a first period within a period of transition from an ON state to an OFF state of the transfer transistor; and
  changing the gate voltage of the transfer transistor in a second changing rate higher than the first changing rate during a second period, continuously following the first period, within the period of transition from the ON state to the OFF state of the transfer transistor.

* * * * *